United States Patent
Ko

(10) Patent No.: US 8,022,483 B2
(45) Date of Patent: Sep. 20, 2011

(54) SEMICONDUCTOR AND MANUFACTURING METHOD FOR THE SAME

(75) Inventor: Kwang Young Ko, Bucheon-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 12/623,803

(22) Filed: Nov. 23, 2009

(65) Prior Publication Data

US 2010/0127321 A1  May 27, 2010

(30) Foreign Application Priority Data

Nov. 24, 2008  (KR) .................. 10-2008-0116725

(51) Int. Cl.
*H01L 29/76* (2006.01)

(52) U.S. Cl. .................. 257/389; 257/E29.021

(58) Field of Classification Search .......... 257/374, 257/389, E29.021, E21.556
See application file for complete search history.

(56) References Cited

U.S. PATENT DOCUMENTS

| 2005/0048707 A1* | 3/2005 | Kao .............. 438/197 |
| 2008/0067615 A1 | 3/2008 | Kim |

FOREIGN PATENT DOCUMENTS

| KR | 10-2005-0069150 A | 7/2005 |
| KR | 10-2008-0025507 A | 3/2008 |

OTHER PUBLICATIONS

Korean Office Action dated Oct. 20, 2010; Korean Patent Application No. 10-2008-0116725; Korean Intellectual Property Office, Republic of Korea.
San Hong Kim; "ESD Protection Device for High Voltage and a Manufacturing Method Thereof, Capable of Reducing Cost by Omitting Mask Utilization Process"; Korean Patent Abstracts; Publication No. 10-2008-0025507; Publication Date: Mar. 21, 2008; Korean Intellectual Property Office, Republic of Korea.
Yoo Seon Song; "Lateral DMOS Device Using Buried Layer and Plug Layer for Reducing Resistance Between Source and Drain"; Korean Patent Abstracts; Publication No. 10-2005-0069150; Publication Date: Jul. 5, 2005; Korean Intellectual Property Office, Republic of Korea.

* cited by examiner

*Primary Examiner* — Quoc Hoang
(74) *Attorney, Agent, or Firm* — The Law Offices of Andrew D. Fortney; Andrew D. Fortney

(57) ABSTRACT

A semiconductor device and a manufacturing method for the same are disclosed. The semiconductor device includes a gate pattern formed at an upper part of the semiconductor substrate to overlap one side of a drift region, and a shallow oxide region disposed adjacent to the gate pattern, having a shallower depth than a plurality of device isolation layers.

18 Claims, 6 Drawing Sheets

SEMICONDUCTOR AND MANUFACTURING METHOD FOR THE SAME

CROSS REFERENCE TO RELATED APPLICATION

This application claims the benefit of Korean Patent Application No. 10-2008-0116725, filed on 24 Nov. 2008, which is hereby incorporated by reference as if fully set forth herein.

BACKGROUND OF THE INVENTION

1. Field of the Invention

The present invention relates to a semiconductor device, and more particularly, to a semiconductor device and a manufacturing method for the same.

2. Discussion of the Related Art

In general, methods for forming a device isolation trench have recently been applied in manufacturing semiconductor devices in accordance with design rules of less than 0.25 µm. In other words, trench technology has been used for device isolation in which trenches between devices are formed according to predetermined design rules by partially etching a semiconductor substrate.

Currently, a shallow trench isolation (STI) method is generally used for device isolation. According to the STI method, trenches are formed by partially etching a silicon substrate, and an insulating film, for example, an oxide layer, is vapor-deposited into the trench. Next, the insulating film is removed from an active region by a chemical mechanical polishing (CMP) process so that the insulating film remains only on a field region.

However, according to the general STI method, the length of a current path is increased compared with isolation structures formed by a local oxidation of silicon (LOCOS) as shown in FIG. 1. As a result, an on-resistance is increased.

Furthermore, since an N-drift region is formed by etching the silicon to form the STI trench, the surface dopant concentration of the N-drift region is reduced, accordingly causing an increase in the on-resistance.

SUMMARY OF THE INVENTION

Accordingly, the present invention is directed to a semiconductor device and a manufacturing method for the same that substantially obviate one or more problems due to limitations and disadvantages of the related art.

An object of the present invention is to provide a semiconductor device capable of (i) maintaining a high surface dopant concentration without inducing an increase of the resistance and (ii) reducing the length of a current path, and a manufacturing method for the same.

Additional advantages, objects, and features of the invention will be set forth in part in the description which follows and in part will become apparent to those skilled in the art upon examination of the following or may be learned from practice of the invention. The objectives and other advantages of the invention may be realized and attained by the structure particularly pointed out in the written description and claims hereof, as well as the appended drawings.

To achieve these objects and other advantages and in accordance with the purpose of the invention, as embodied and broadly described herein, a semiconductor device includes a plurality of device isolation layers, a gate pattern formed over the semiconductor substrate overlapping with a drift region, and an isolation oxide in the drift region adjacent to the gate pattern, the isolation oxide in the drift region having a shallower depth than the plurality of device isolation layers.

In another aspect of the present invention, a manufacturing method for a semiconductor device includes forming a well region by implanting dopants into a semiconductor substrate, forming a drift region by implanting dopants into a portion of the well region, forming an oxide layer by oxidizing a portion of the drift region, removing the oxide layer to form a recessed area in the drift region, forming trenches at both sides of the drift region, depositing an insulating material over the semiconductor substrate, and etching the insulating material formed on the semiconductor substrate to form a device isolation layer in each of the trenches and an oxide region in the recessed area in the drift region.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and constitute a part of this application, illustrate embodiment(s) of the invention and along with the description serve to explain the principle of the invention. In the drawings.

DETAILED DESCRIPTION OF THE INVENTION

Reference will now be made in detail to the embodiments of the present invention, examples of which are illustrated in the accompanying drawings. Wherever possible, the same reference numbers will be used throughout the drawings to refer to the same or like parts.

Hereinafter, a semiconductor device according to an embodiment of the present invention will be explained in detail with reference to FIG. 2G.

Figure 1:
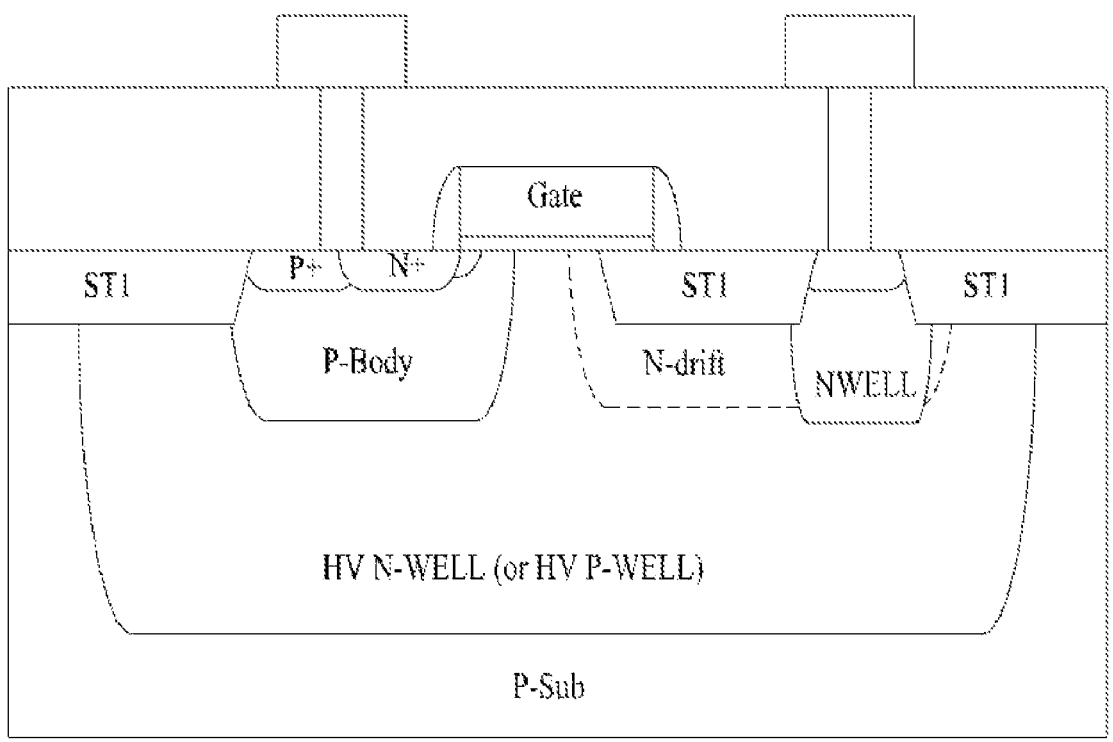
FIG. 1 is a cross-sectional view of a conventional semiconductor device including a shallow trench isolation (STI) structure.
Figure 2A:
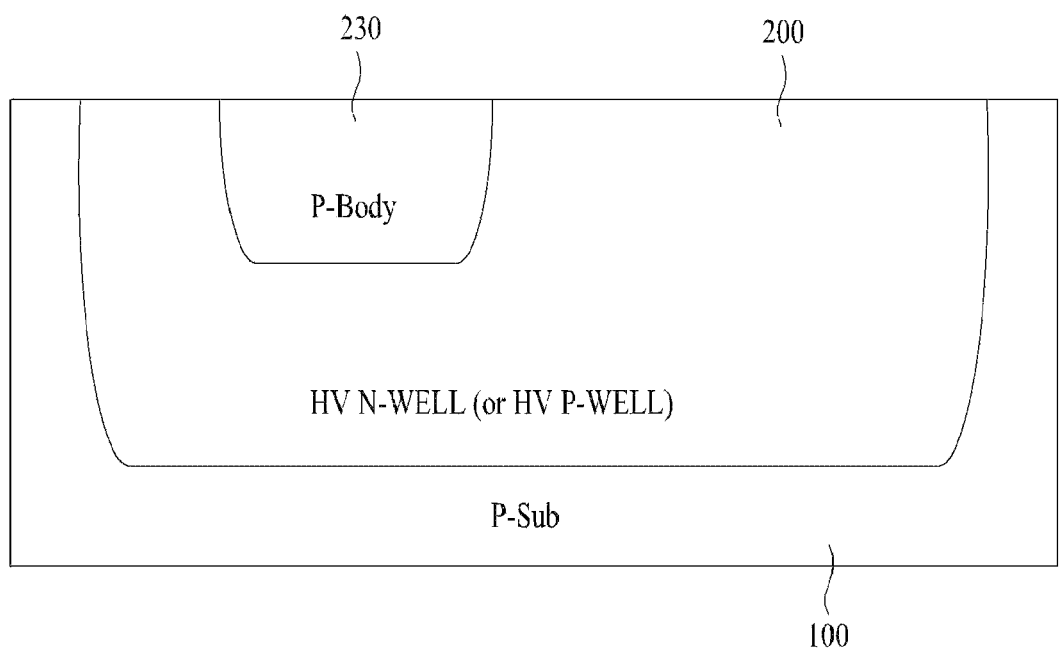
FIG. 2A to FIG. 2G are cross-sectional views illustrating processes of manufacturing a semiconductor device according to an exemplary embodiment of the present invention.
Figure 2B:
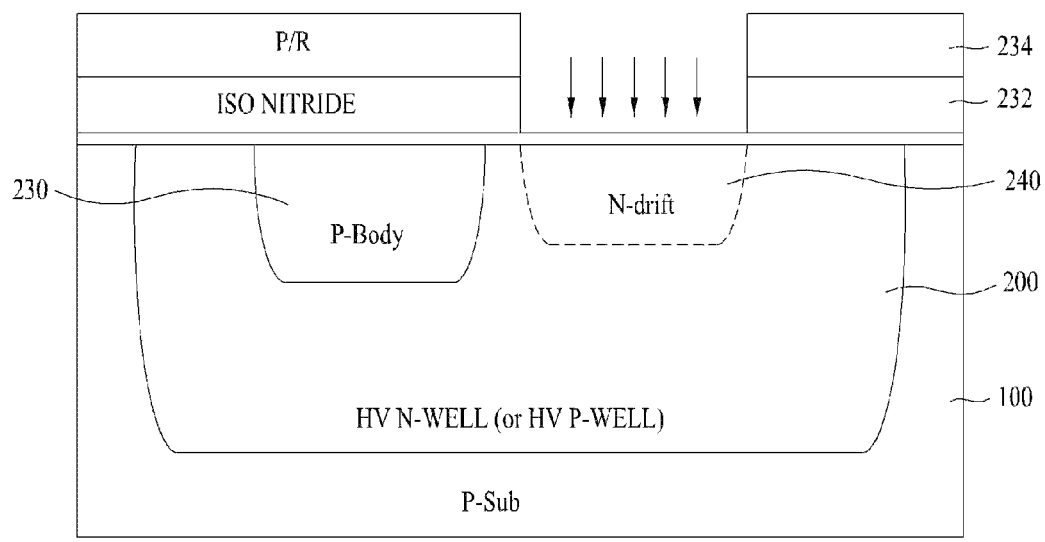
Figure 2C:
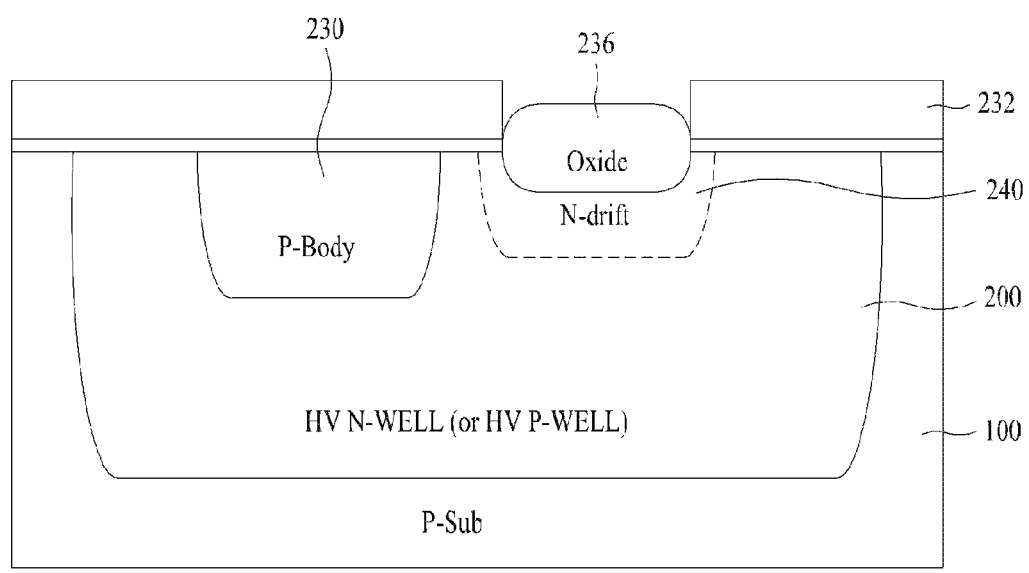
Figure 2D:
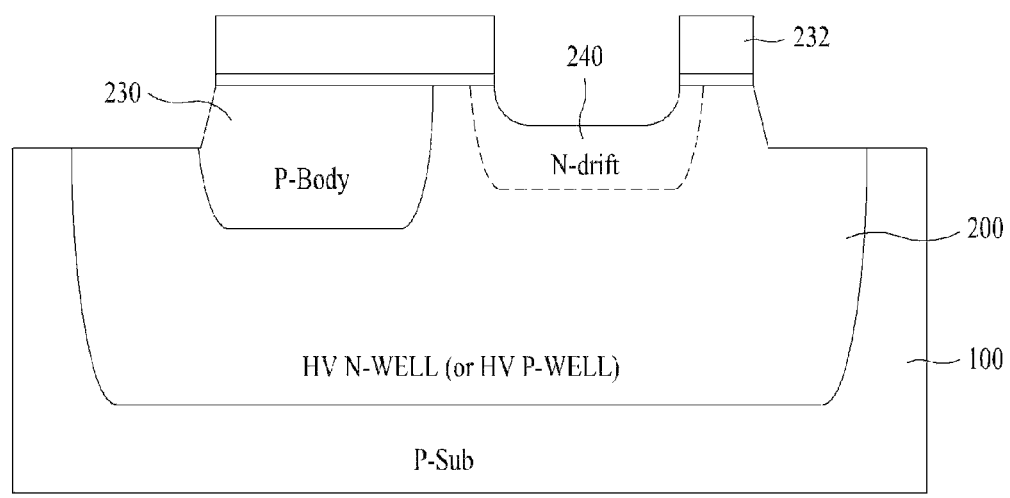
Figure 2E:
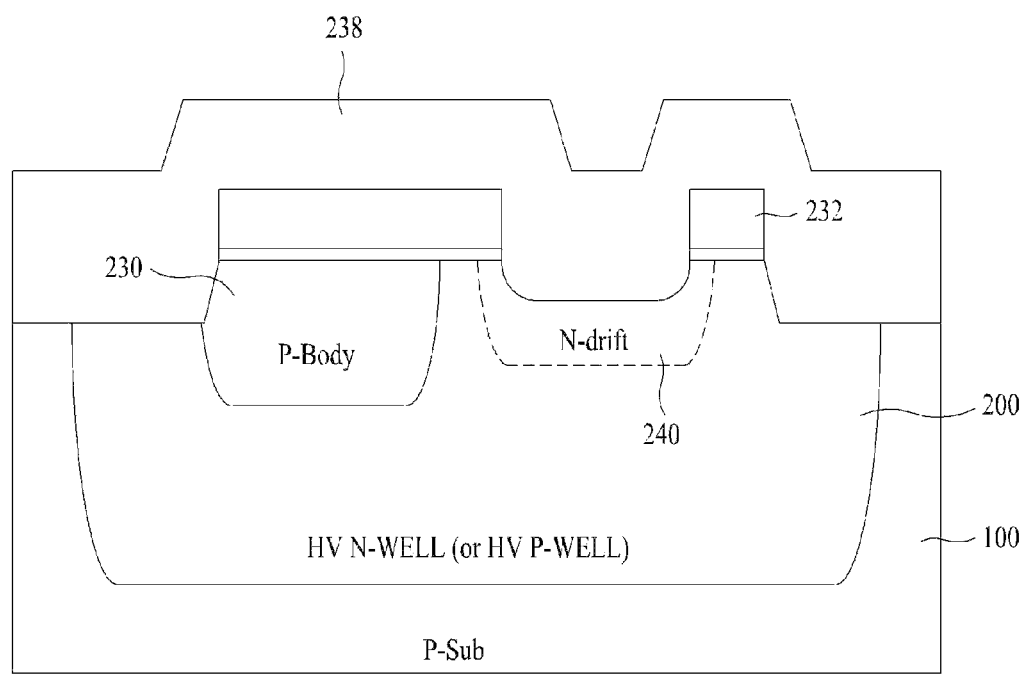
Figure 2F:
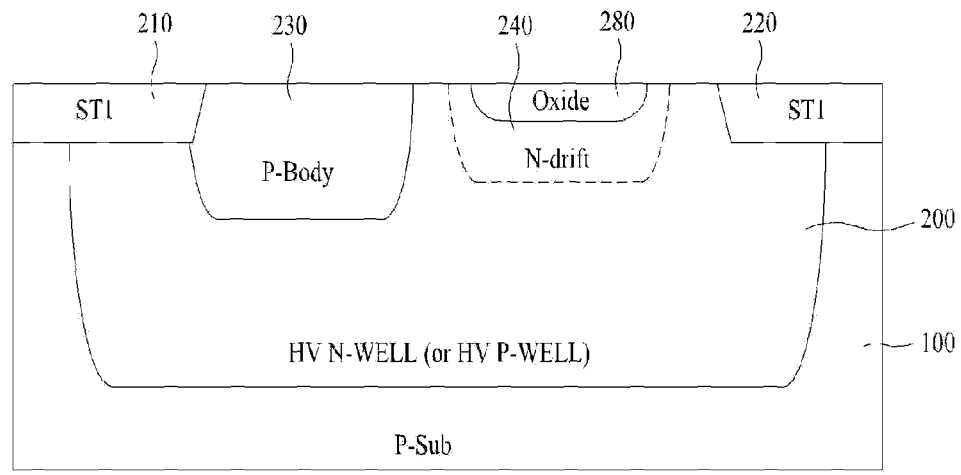
Figure 2G:
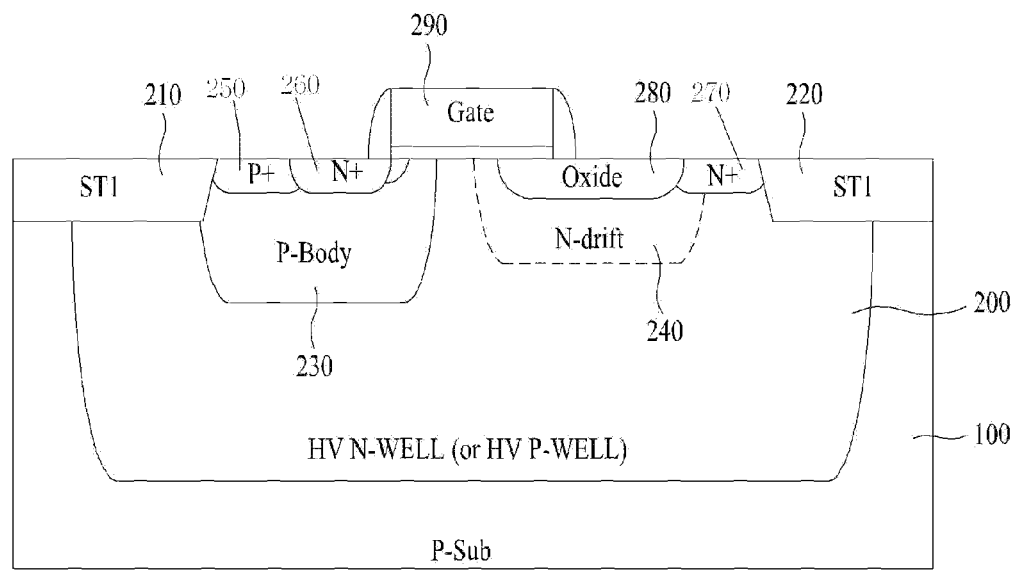

FIG. 2G is a cross-sectional view showing a lateral double metal oxide semiconductor (LDMOS) transistor including a shallow trench isolation (STI) region, according to an embodiment of the present invention.

As shown in FIG. 2G, the LDMOS transistor includes a silicon semiconductor substrate 100 (which may be a single-crystal silicon wafer, or a single-crystal silicon wafer with one or more layers of epitaxial silicon grown thereon), and an N-well region 200 doped with one or more N-type dopants (e.g., P, As, and/or Sb). Alternatively, well region 200 may be doped with a P-type dopant (e.g., B).

Field insulating films 210 and 220 are formed in a field region of the semiconductor substrate 100, overlapping at least part of the N-well region 200. A P-type body region 230 doped with a P-type dopant (e.g., B and/or $BF_2$) adjacent to the field insulating film 210, and an N-type drift region 240 doped with one or more N-type dopants (e.g., P, As, and/or Sb) are formed in the N-well region 200. Also, a source contact region 250 doped with a high concentration of $P^+$-type dopant is formed in the surface of the P-type body region 230.

A source region 260 doped with a high concentration of $N^+$-type dopant is formed in the surface of the P-type body region 230, immediately adjacent to the source contact region 250. On an opposite side of a gate electrode 290 from the source region 260, a drain region 270 doped with a high concentration of N$^+$-type dopant is formed in the surface of the N-well region 200 and adjacent to the field insulating film 220. In general, the source region 260 and the drain region 270 include the same dopant(s) in the same concentration(s).

The gate electrode 290 is formed on the semiconductor substrate 100. A field insulating layer 280 is formed in a surface of the N-drift region 240 to enhance the breakdown characteristics of the transistor.

Here, the field insulating layer 280 located in the N-drift region 240 is rounded. Specifically, ends, corners, and/or edges of the field insulating layer 280 are rounded, and field insulating layer 280 has no sharp edges at an interface with the semiconductor substrate 100. Therefore, a current path can be reduced compared to conventional STI structures (which generally have sharp trench corners created by anisotropic etching). Consequently, the on-resistance can be reduced in the present semiconductor device.

Also, the field insulating layer 280 is formed by removing an oxide layer generated through a LOCOS oxidation process on the surface of the semiconductor substrate 100 using HF gas, water vapor, and an inert gas (e.g., N$_2$) rather than by wet or plasma etching a surface of the silicon substrate. The gas etch removes the oxide layer at a controllable rate and leaves a rounded recessed area in the N-drift region 240 that is complementary to the shape of the LOCOS oxide layer. Next, an STI material (e.g., an oxide layer) is deposited over the semiconductor substrate 100 including the rounded recess area of the N-drift region 240 to form isolation structures. Therefore, a high surface concentration of dopant ions in the N-drift region 240 can be maintained. The on-resistance may also be reduced.

Hereinafter, a manufacturing method for the semiconductor device according to the embodiment of the present invention will be described in detail with reference to FIG. 2A to FIG. 2G.

Referring to FIG. 2A, the N-well region 200 is formed on the P-type semiconductor substrate 100. The N-well region 200 may be a high voltage N-well formed by implanting one or more N-type ions (e.g., P, As, and/or Sb) into the semiconductor substrate 100. The P-type body region 230 is formed in the N-well region 200. The P-type body region 230 may be formed by implanting a P-type ion (e.g., B and BF$_2$) into the semiconductor substrate 100.

Subsequently, a pad oxide layer may be formed over the substrate by thermal oxidation of the substrate (e.g., wet or dry thermal oxidation of the semiconductor substrate 100 to a temperature of from 800 to 1200° C.), or chemical vapor deposition (CVD; e.g., low pressure CVD [LPCVD], or plasma enhanced CVD [PECVD]). An isolation nitride layer 232 (e.g., silicon nitride) is then formed over the pad oxide layer by physical vapor deposition (PVD; e.g., sputtering) or CVD (e.g., PECVD or LPCVD). A photoresist pattern 234 is formed on the nitride layer 232 by depositing a photoresist layer (e.g., a negative or positive photoresist material) over the second oxide film 120 and photolithographically patterning the photoresist layer to define the drift region 240. The nitride layer 232 is then anisotropically etched (e.g., by dry etching, such as reactive ion etching [RIE]) using the photoresist pattern 234 as a mask.

Referring to FIG. 2B, an N-type dopant is implanted in an upper part of the N-well region 200 using the patterned nitride layer 232 and a photoresist pattern 234 as masks, thereby forming the N-drift region 240.

Referring to FIG. 2C, the photoresist pattern 234 is removed by asking or stripping, and thermal oxidation is performed on an exposed upper part of the N-drift region 240 using the patterned nitride layer 232 as a mask to form an oxide layer 236.

That is, the oxide layer 236 is formed in the same manner as the general local oxidation of silicon (LOCOS) manufacturing method (e.g., wet or dry thermal oxidation of the N-drift region 240 of the semiconductor substrate 100 at a temperature of from 800 to 1200° C.). Accordingly, the oxide layer 236 in the N-drift region 240 has rounded edges.

A photoresist pattern (not shown, and formed using techniques described above) is then formed over the semiconductor substrate 100 to define STI regions. As shown in FIG. 2D, the nitride layer 232 is patterned (e.g., by an anisotropic etch using the photoresist pattern as a mask) at the STI regions. Subsequently, the substrate 100 is partially etched (e.g., anisotropically etched by RIE) using the patterned nitride layer 232 as a mask to form STI trenches, in which field insulating films 210 and 220 will be formed.

The oxide layer 236 is then removed by a gas etch using HF gas, water vapor, and an inert gas (e.g., N$_2$, or alternatively a noble gas such as Ar, Ne, He, Kr, or Xe) at a temperature in a range of about 20~400° C. (e.g., 50 to 150° C. or any range of values therein). According to the above method, a recessed region remaining in the N-drift region 240 after removal of the LOCOS oxide layer 236 has rounded edges and corners and has a shape that is complementary to the LOCOS oxide layer 236.

As shown in FIG. 2E, a silicon oxide 238 including SiO$_2$ is deposited by CVD (e.g., LPCVD or PECVD of TEOS (tetraethylorthosilicate) or silane (e.g., SiH$_4$) as a silicon source and dioxygen (O$_2$) and/or ozone (O$_3$) as an oxygen source) over the entire surface of the semiconductor substrate 100.

As shown in FIG. 2F, the silicon oxide 238 is removed by chemical mechanical polishing (CMP) until an upper surface of the nitride layer 232 is exposed. Subsequently, the remaining portion of silicon oxide 238 is removed by wet-etching (e.g., using aqueous hydrofluoric acid, which may be diluted with deionized water and/or buffered with ammonia and/or ammonium fluoride) until the upper surface of silicon substrate 100 is exposed and the nitride layer 232 is removed.

As a result, the STI insulating material fills the recessed region in the N-drift region 240, from which the oxide layer 236 has been removed, thereby forming an oxide region 280. Since the oxide region 280 is shallower and has more rounded shape than in a conventional device, the length of a current path disposed under the oxide layer 280 can be reduced. Furthermore, since the surface dopant ion concentration of the N-drift region 240 is maintained higher than in conventional STI structures, the on-resistance can be reduced.

Referring to FIG. 2G, a gate pattern 290 is formed over the N-well region 200 and the N-drift region 240. The gate pattern 290 includes a gate oxide layer (e.g., formed by thermal oxidation of the semiconductor substrate 100), and a gate polysilicon layer (e.g., formed by depositing a polysilicon layer over the gate oxide layer by CVD and then patterning the polysilicon layer to form the gate polysilicon layer).

A capping layer (not shown) containing an oxide (e.g., SiO$_2$) is formed to cover the gate pattern 290 including the gate oxide layer and the gate polysilicon layer. A photoresist pattern (not shown) is formed on the capping layer. A shallow high-concentration N$^+$ dopant implant is then performed using the photoresist pattern as a mask, thereby forming the source region 260 and drain region 270 doped with N$^+$ dopant. A second photoresist pattern exposing a source region 250 is formed and is used as a mask to implant a P$^+$ dopant at a shallow depth and a higher concentration than the source and drain regions 260, 270 to form a source contact region 250. Alternatively, a third photoresist pattern may be formed to expose the region of the substrate 100 between oxide layer 280 and STI 220 containing part of the N-drift region 240, and a shallow, high-concentration N⁺ dopant implant is performed to form drain region 270.

Next, a silicon nitride layer is deposited by CVD (e.g., LPCVD or PECVD) on the entire surface of the gate pattern 290. A spacer for the nitride layer is formed on each sidewall of the gate pattern 290 through an etch-back process. Subsequently, a silicide process may be performed on the gate electrode 290 so that an upper portion of the gate electrode 290 is converted to a metal silicide.

As apparent from the above description, in accordance with a semiconductor device and a manufacturing method thereof according to the above-described embodiment of the present invention, since an isolation structure with a rounded corners and edges is formed in a surface of silicon, the current path may be reduced, thereby minimizing the on-resistance. Also, since a stepped or recessed structure is formed through oxidation, not by etching the silicon surface, the high surface concentration of an N-drift region may be maintained, thereby further minimizing the on-resistance.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A semiconductor device comprising:
    a well region in a semiconductor substrate;
    a plurality of device isolation layers adjacent to the well region;
    a drift region in the well region;
    a gate pattern over the semiconductor substrate and overlapping with the drift region; and
    an oxide region adjacent to the gate pattern in the drift region, having rounded edges at an interface with the semiconductor substrate and a shallower depth than the plurality of device isolation layers, the oxide region (i) having an uppermost surface that is coplanar with an uppermost surface of the drift region and (ii) reducing a current path under the oxide region.

2. The semiconductor device according to claim 1, wherein the oxide region comprises a same material as the plurality of device isolation layers.

3. The semiconductor device according to claim 1, wherein the oxide region has a planar uppermost surface.

4. The semiconductor device according to claim 3, wherein the oxide region has a lowermost surface substantially identical to that of a LOCOS oxide structure.

5. The semiconductor device according to claim 1, wherein the oxide region has a shallower depth than the drift region.

6. The semiconductor device according to claim 5, wherein the oxide region has a smaller width than the drift region.

7. The semiconductor device according to claim 1, wherein the uppermost surface of the oxide region is coplanar with uppermost surfaces of the plurality of device isolation layers.

8. The semiconductor device according to claim 1, further comprising a P-type body region in the well region.

9. The semiconductor device according to claim 8, further comprising a source contact region and a source region in the P-type body region.

10. The semiconductor device according to claim 1, further comprising a drain region in the well region and overlaps with the oxide region.

11. The semiconductor device according to claim 1, wherein the oxide region reduces the current path under the oxide region relative to the device isolation layers.

12. A lateral double metal oxide semiconductor (LDMOS) transistor comprising:
    a well region in a semiconductor substrate;
    a plurality of shallow trench isolation films in a field region of the semiconductor substrate, overlapping the well region;
    a drift region in the well region;
    a gate electrode over the well region and the drift region;
    a source region and a drain region in the substrate on opposite sides of the gate electrode; and
    an oxide region in the drift region, wherein the oxide region (i) has a lowermost surface substantially identical to that of a LOCOS oxide structure and an uppermost surface that is coplanar with an uppermost surface of the drift region, and (ii) overlaps with the drain region.

13. The LDMOS transistor according to claim 12, wherein the oxide region has a planar uppermost surface.

14. The LDMOS transistor according to claim 12, wherein the oxide region has a shallower depth than the drift region.

15. The LDMOS transistor according to claim 14, wherein the oxide region has a smaller width than the drift region.

16. The LDMOS transistor according to claim 12, further comprising a P-type body, and a source contact region.

17. The LDMOS transistor according to claim 12, wherein the oxide region comprises a same material as the plurality of field insulating films.

18. The LDMOS transistor according to claim 12, wherein the oxide region reduces a current path relative to the shallow trench isolation films.

* * * * *